United States Patent
Krems et al.

(10) Patent No.: US 9,106,206 B2
(45) Date of Patent: Aug. 11, 2015

(54) SURFACE ACOUSTIC WAVE FILTER AND DUPLEXER COMPONENT

(75) Inventors: Tobias Krems, Munich (DE); Ravi Challa, Rancho Santa Margarita, CA (US)

(73) Assignee: EPCOS AG, Munich (DE)

( * ) Notice: Subject to any disclaimer, the term of this patent is extended or adjusted under 35 U.S.C. 154(b) by 688 days.

(21) Appl. No.: 13/331,937

(22) Filed: Dec. 20, 2011

(65) Prior Publication Data

US 2012/0235766 A1 Sep. 20, 2012

(30) Foreign Application Priority Data

Dec. 22, 2010 (DE) .......................... 10 2010 055 664

(51) Int. Cl.
*H03H 9/72* (2006.01)
*H03H 9/00* (2006.01)

(52) U.S. Cl.
CPC ............. *H03H 9/725* (2013.01); *H03H 9/0042* (2013.01)

(58) Field of Classification Search
CPC ............................. H03H 9/725; H03H 9/0042
USPC .......................... 333/133, 193, 194, 195, 196; 310/313 B, 313 D
See application file for complete search history.

(56) References Cited

U.S. PATENT DOCUMENTS

| | | | |
|---|---|---|---|
| 6,985,048 B2 * | 1/2006 | Takamine et al. | ............. 333/133 |
| 2003/0035557 A1 * | 2/2003 | Takamine et al. | ............. 381/111 |
| 2003/0201846 A1 * | 10/2003 | Nakamura et al. | ............. 333/193 |
| 2004/0080385 A1 | 4/2004 | Takamine et al. | |
| 2008/0284540 A1 * | 11/2008 | Nishihara et al. | ............. 333/133 |
| 2009/0009263 A1 | 1/2009 | Javid et al. | |
| 2009/0289745 A1 | 11/2009 | Bauer et al. | |

FOREIGN PATENT DOCUMENTS

| | | | |
|---|---|---|---|
| DE | 10 2004 037 821 A1 | 3/2006 | |
| DE | 10 2005 010 658 A1 | 9/2006 | |
| DE | 10 2006 057 340 A1 | 6/2008 | |
| WO | WO2009113274 | * 9/2009 | ............... H03H 9/64 |

OTHER PUBLICATIONS

Nakamura, H., et al., "An analysis and improvement of balanced-type SAW filters," Proceedings of the IEEE Ultrasonics Symposium, 2002, 4 pages.

* cited by examiner

*Primary Examiner* — Benny Lee
*Assistant Examiner* — Jorge Salazar, Jr.
(74) *Attorney, Agent, or Firm* — Slater & Matsil, L.L.P.

(57) ABSTRACT

A surface acoustic wave filter includes an arrangement of transducers having at least one first transducer one second transducer and one third transducer. The at least one first transducer is connected to the input terminal and a terminal for applying a reference potential. The second transducer is connected to the first output terminal and the terminal for applying the reference potential. The third transducer is connected to the second output terminal and the terminal for applying the reference potential. A capacitor is connected to at least one of a first and second output terminal in such a way that the capacitor is connected between the first and second output terminals or between one of the first and second output terminals and the terminal for applying the reference potential.

16 Claims, 12 Drawing Sheets

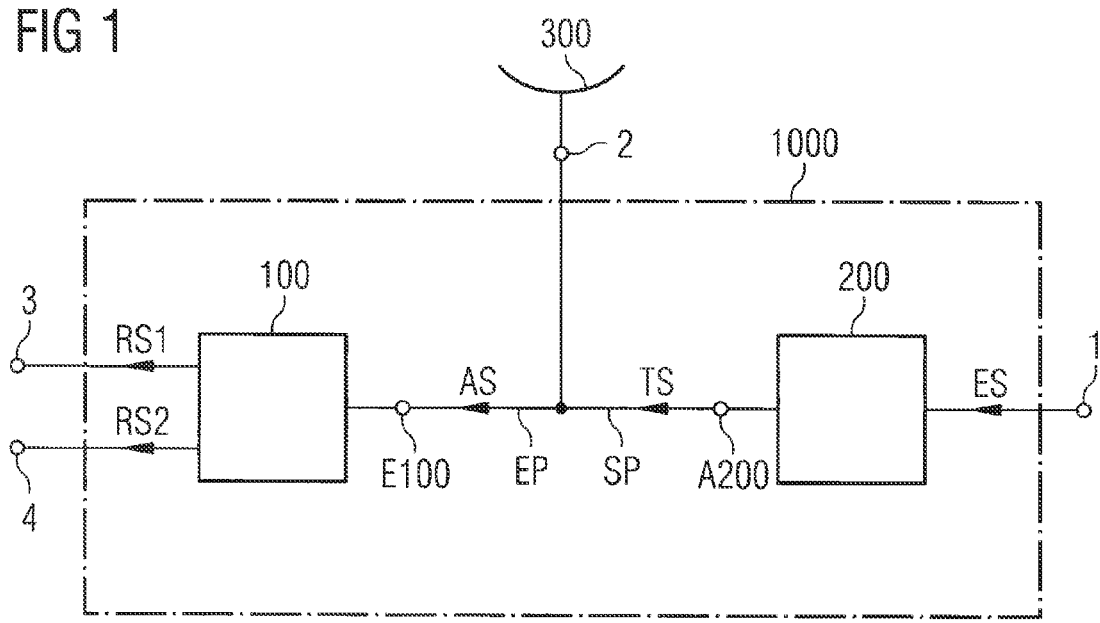

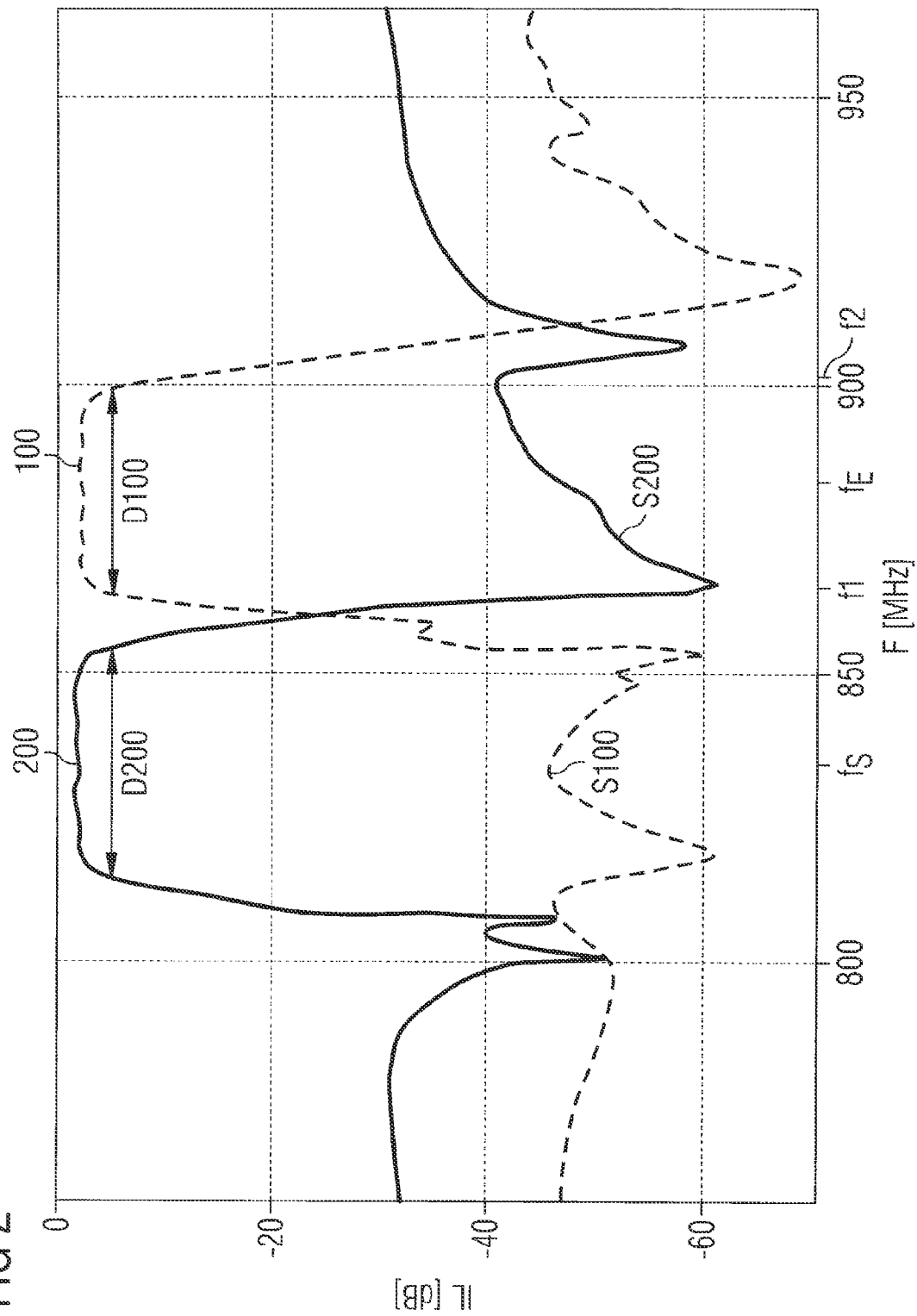

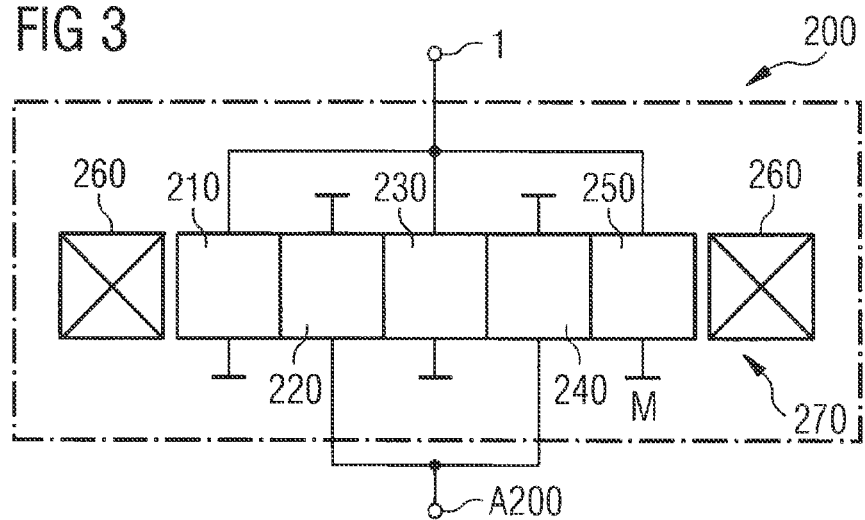
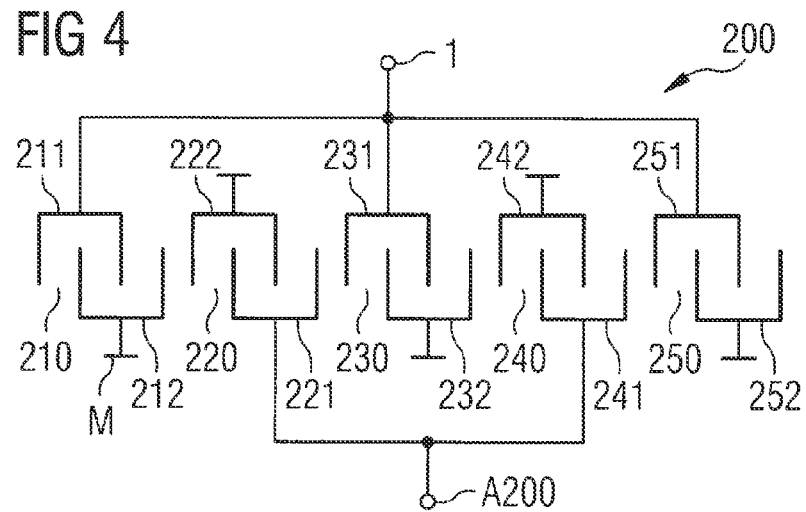
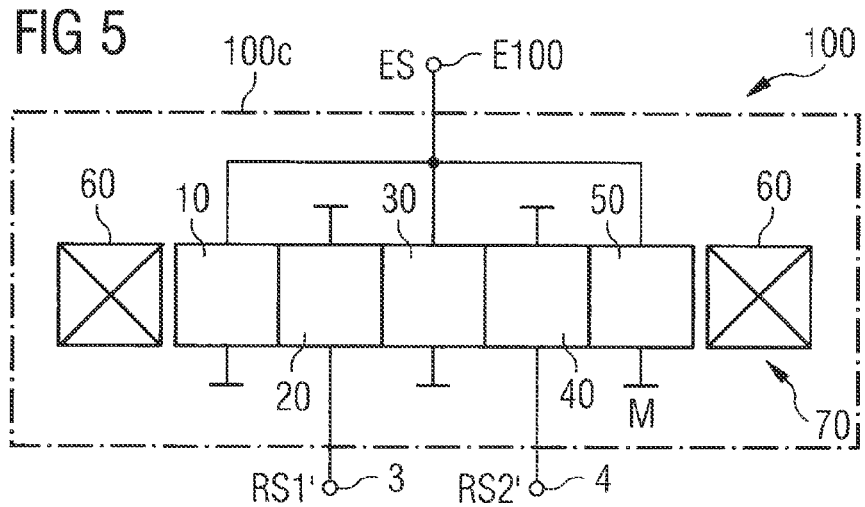

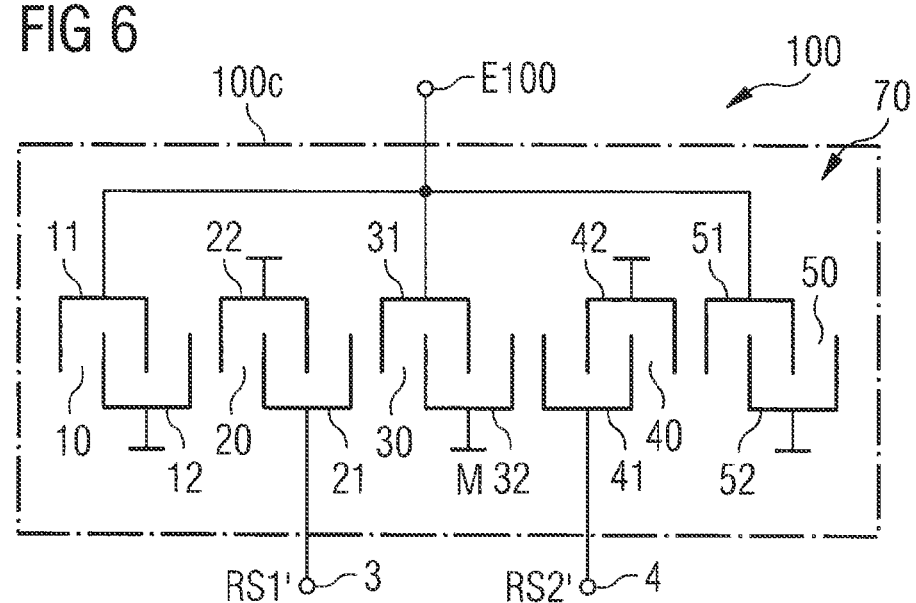
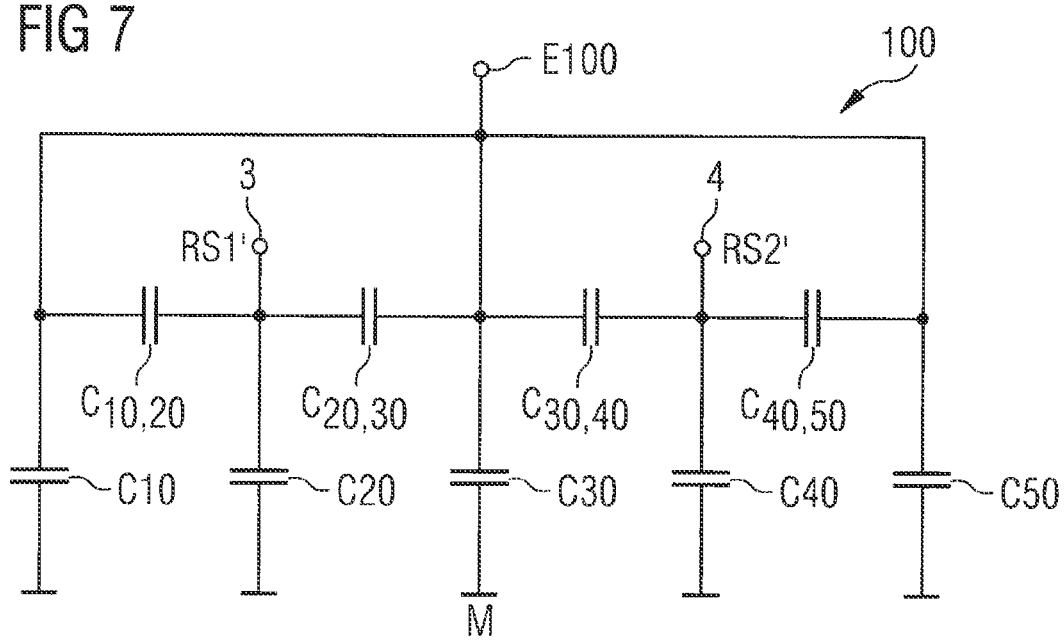

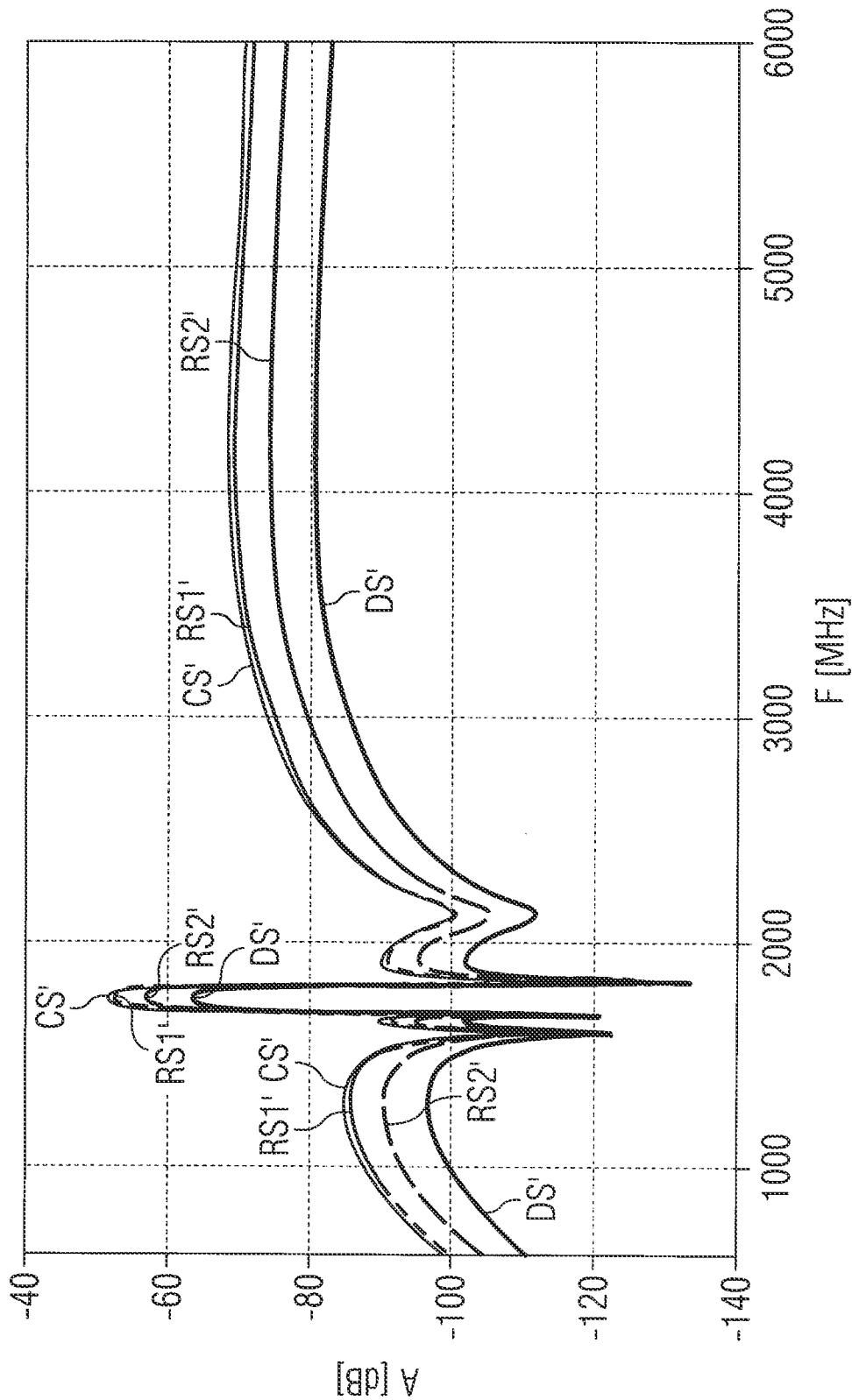

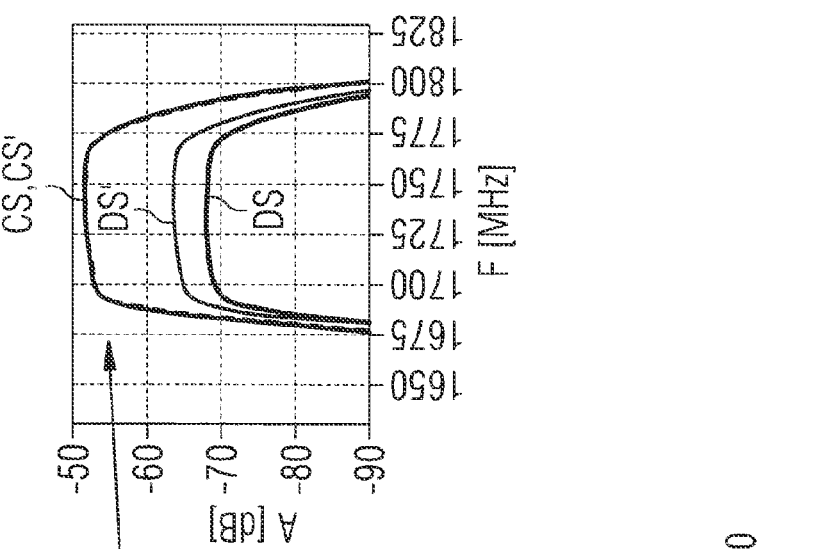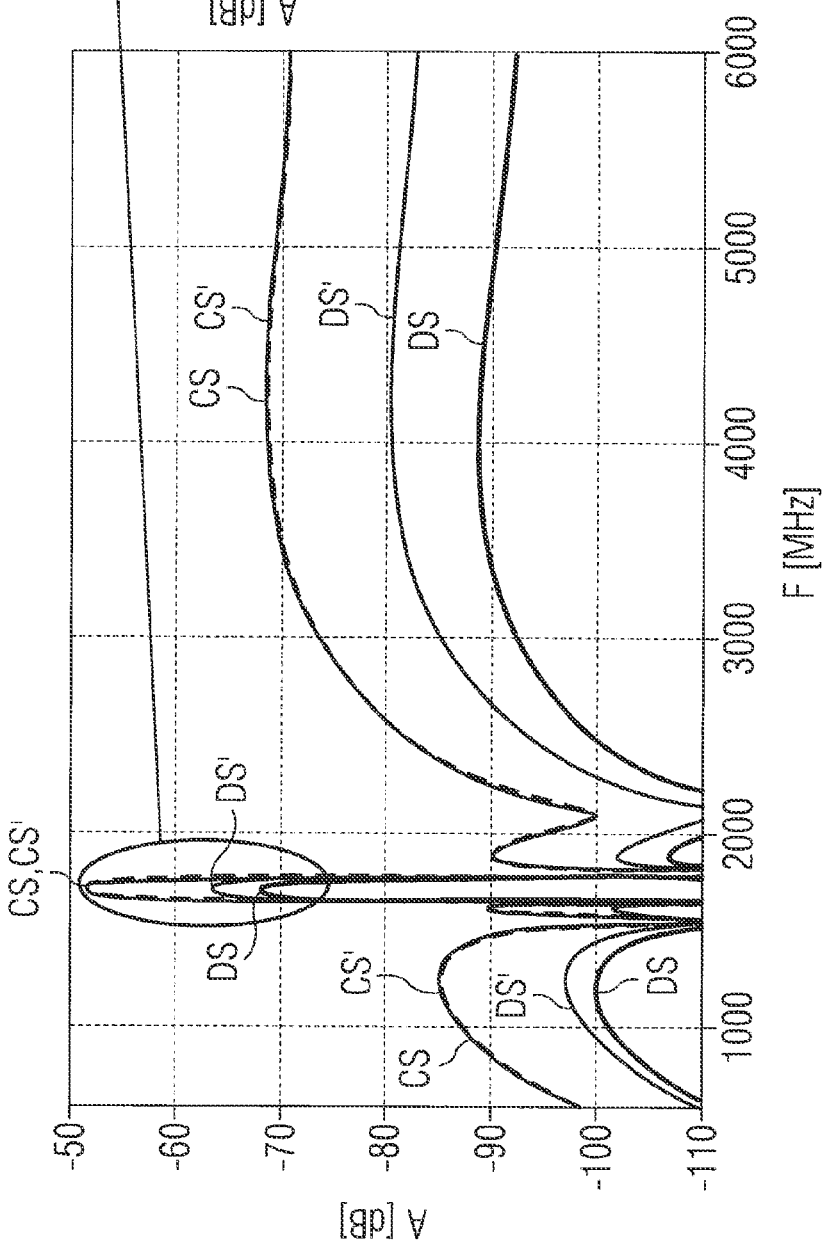

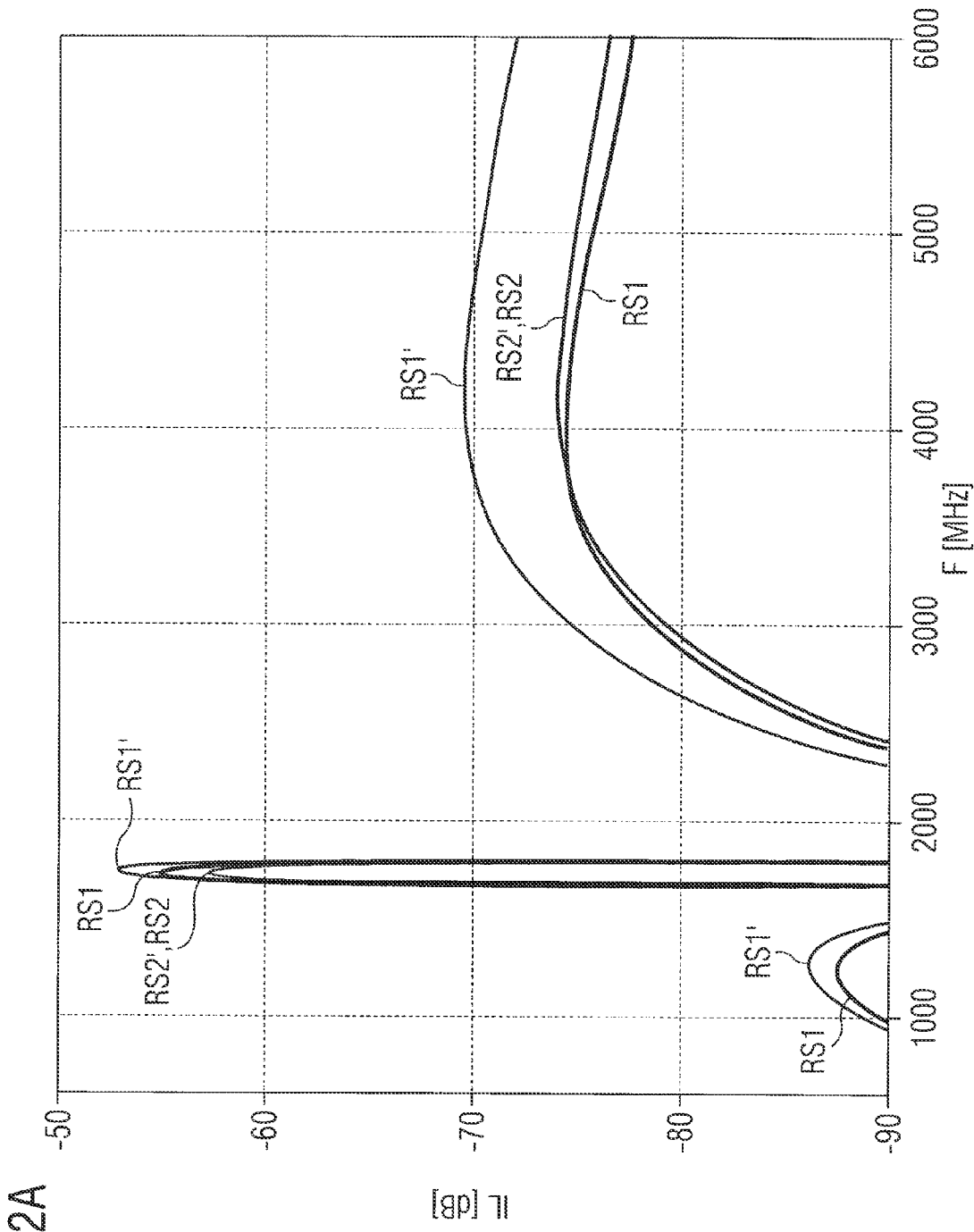

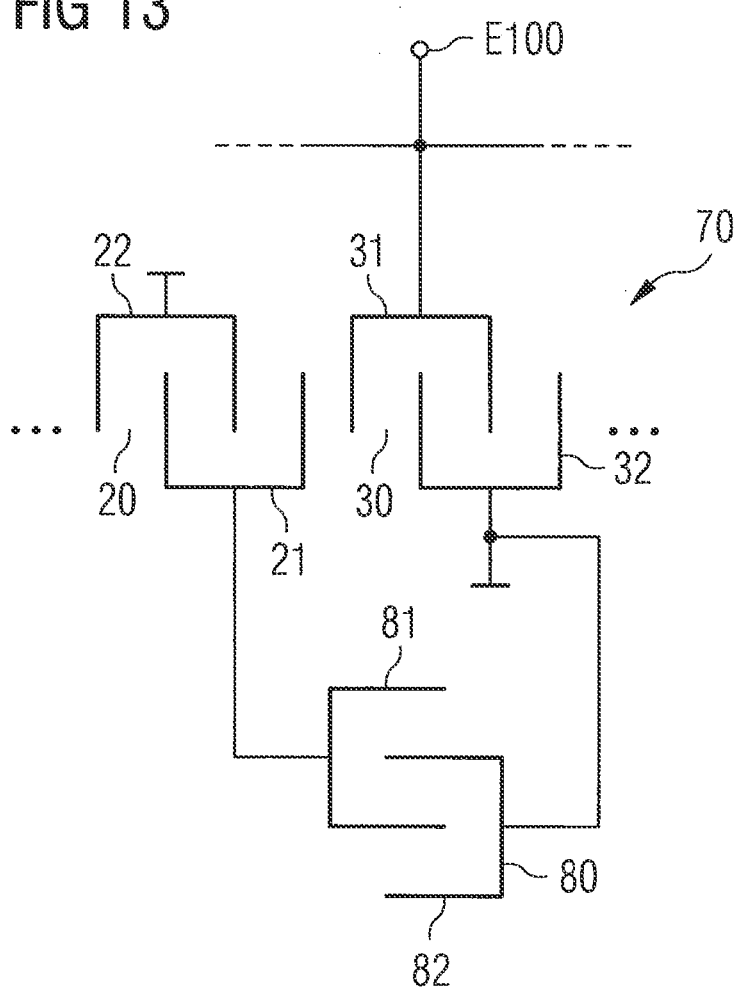

SURFACE ACOUSTIC WAVE FILTER AND DUPLEXER COMPONENT

This application claims priority to German Patent Application 10 2010 055 664.5, which was filed Dec. 22, 2010 and is incorporated herein by reference.

TECHNICAL FIELD

Embodiments of the invention relate to a surface acoustic wave filter having an asymmetrical arrangement of transducer structures. Embodiments of the invention furthermore relate to a duplexer component comprising a respective surface acoustic wave filter in the transmission path and reception path of the duplexer component.

BACKGROUND

A duplexer component, in particular an antenna duplexer, has a transmission path, in which transmission signals generated by a transmitter are forwarded to a terminal for connecting an antenna. Furthermore, the duplexer component comprises a reception path, in which reception signals are forwarded from the antenna to a receiver.

A surface acoustic wave filter can be arranged as a transmission filter in the transmission path. The surface acoustic wave filter in the transmission path can have an input terminal for applying a transmission signal and an output terminal for outputting an output signal that is forwarded to the antenna for emission. The transmission filter is intended to have a passband having a low insertion loss for frequencies of the transmission signal to be emitted. Outside the passband, the transmission filter is intended to have a stop band having a high insertion loss, in order that interference signals do not reach the antenna or the transmitter via the transmission path.

A surface acoustic wave filter can likewise be arranged as a reception filter in the reception path, the filter having a passband having a low insertion loss in the frequency range of the reception signals to be received by the antenna. Outside the passband, the reception filter is intended to have a stop band having a high insertion loss, since received signals having frequencies in the stop band are intended to be suppressed to the greatest possible extent by the reception filter. The surface acoustic wave filter in the reception path can have an input terminal for applying the signal received by the antenna and a first output terminal for outputting a first output signal and a second output terminal for outputting a second output signal. By means of an embodiment of this type, the reception filter can be operated in an asymmetrical (unbalanced or single-ended) manner at the input side and in a symmetrical (balanced) manner at the output side.

In the case of a duplexer component, the surface acoustic wave filters in the transmission and reception paths can be embodied in such a way that the passband of the reception filter is spaced apart from the passband of the transmission filter by a few MHz, for example, 20 MHz to 100 MHz. For symmetrically operated duplexer components having a large frequency separation between the passband in the transmission path and reception path, the suppression of a signal having frequencies in the passband of the transmission filter by the reception filter and the suppression of a signal having frequencies in the passband of the reception filter by the transmission filter are intended to be as high as possible. Furthermore, a high degree of isolation between transmission and reception paths is desired.

These requirements could be fulfilled to the greatest possible extent by means of a symmetrical arrangement of transducer structures of the surface acoustic wave filter in the reception path and of the surface acoustic wave filter in the transmission path. However, since the surface acoustic wave filter in the reception path is operated asymmetrically on the input side and symmetrically on the output side, the transducers of the surface acoustic wave filter in the reception path are arranged asymmetrically. On account of the asymmetrical orientation of the transducers, a phase difference of 180° can be obtained between the output signals at the first and second output terminals of the reception filter.

The asymmetrical arrangement of the transducer structures has the effect, however, that signals which are coupled into the reception path from the transmission filter, between the input side of the transmission filter and the first output terminal of the reception path, experience a different attenuation than those signals which are transferred between the input terminal of the transmission filter and the second output terminal of the reception filter. On account of this asymmetry, therefore, a non-uniform isolation occurs between the transmission path and the reception path.

SUMMARY OF THE INVENTION

Embodiments of the present invention specify a surface acoustic wave filter which is operated symmetrically and in which high and uniform suppression of signals between the input terminal and each of the two output terminals is obtained in the stop band of the filter. Further embodiments specify a duplexer component which comprises a surface acoustic wave filter in the reception and/or transmission path and which has a high degree of isolation between the transmission path and reception path.

An embodiment of a surface acoustic wave filter comprises an input terminal for applying an input signal, a first output terminal for outputting a first output signal and a second output terminal for outputting a second output signal, and also an arrangement of transducers for converting electrical/acoustic signals into acoustic/electrical signals. The arrangement of transducers comprises at least one first transducer, one second transducer and one third transducer. The at least one first transducer is connected to the input terminal and a terminal for applying a reference potential. The second transducer is connected to the first output terminal and the terminal for applying the reference potential. The third transducer is connected to the second output terminal and the terminal for applying the reference potential. A capacitor is connected to at least one of the first and second output terminals in such a way that the capacitor is connected between the first and second output terminals or the capacitor is connected between one of the first and second output terminals and the terminal for applying the reference potential.

By connecting up the surface acoustic wave filter with a capacitor between the output terminals, in the stop band of the surface acoustic wave filter it is possible to decrease a high coupling capacitance between transducer structures of the surface acoustic wave filter and to increase a static transducer capacitance. By connecting up the surface acoustic wave filter with a capacitor between the output terminal and the terminal for applying the reference potential, a high coupling capacitance between transducers of the surface acoustic wave filter is reduced. By connecting up the surface acoustic wave filter with the capacitor on the output side, the symmetry of a DMS track can be improved.

The surface acoustic wave filter can be used in a duplexer component, for example, in order to increase the isolation between a transmission path and reception path of the duplexer component. In accordance with one embodiment, a duplexer component comprises a surface acoustic wave filter in accordance with the embodiment specified above and a further surface acoustic wave filter comprising an input terminal for applying a further input signal and an output terminal for outputting a further output signal. The filter furthermore comprises a terminal for connecting a transmitting/receiving component. The input terminal of the surface acoustic wave filter and the output terminal of the further surface acoustic wave filter are respectively connected to the terminal for connecting the transmitting/receiving component.

BRIEF DESCRIPTION OF THE DRAWINGS

The invention is explained in greater detail below with reference to figures showing exemplary embodiments of the present invention, in which:

FIG. 1 shows an embodiment of a duplexer component;

FIG. 2 shows a transfer function of a transmission filter and reception filter of a duplexer component;

FIG. 3 shows an embodiment of a transmission filter of a duplexer component;

FIG. 4 shows an arrangement of transducers of an embodiment of a transmission filter of a duplexer component;

FIG. 5 shows an embodiment of a reception filter of a duplexer component;

FIG. 6 shows an arrangement of transducers of an embodiment of a reception filter of a duplexer component;

FIG. 7 shows an equivalent circuit diagram for a reception filter of a duplexer component in the stop band;

FIG. 8 shows transfer functions for describing isolation between a transmission path and a reception path of an embodiment of a duplexer component;

FIG. 10B shows transfer functions for identifying isolation between a transmission path and reception path of a duplexer component;

FIG. 10C shows transfer functions for identifying isolation between a transmission path and reception path of a duplexer component in an enlarged illustration;

FIG. 12A shows transfer functions for identifying a signal transfer between a transmission path and reception path of the duplexer component;

FIG. 13 shows an excerpt from a realization of a surface acoustic wave filter with a capacitor connected to an output terminal of the surface acoustic wave filter.

DETAILED DESCRIPTION OF ILLUSTRATIVE EMBODIMENTS

Figure 9A:
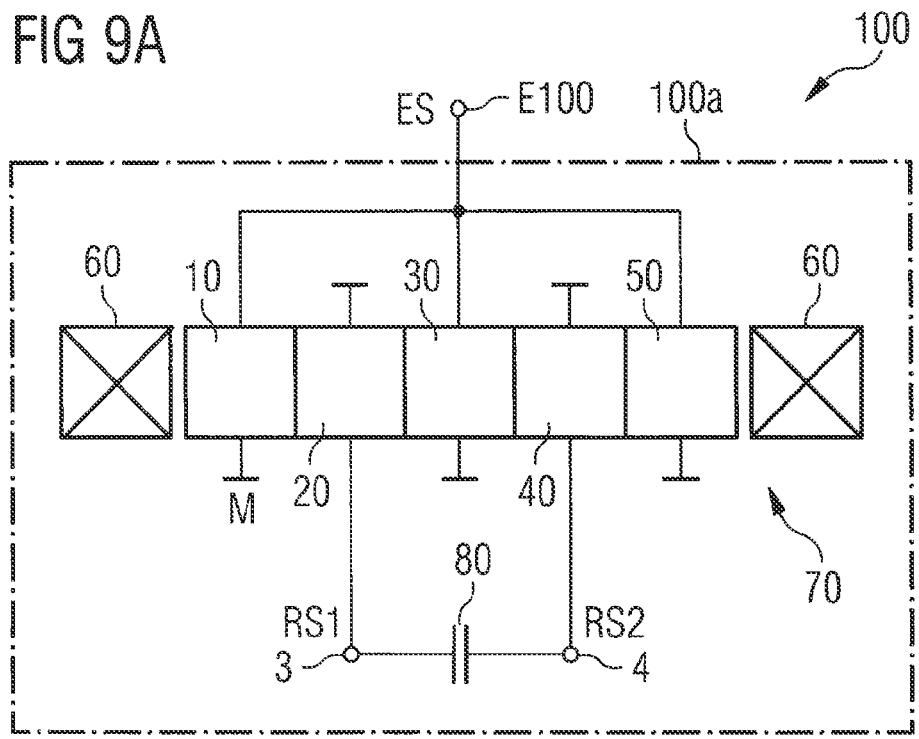
FIG. 9A shows an embodiment of a filter of a duplexer component.

FIG. 1 shows an embodiment of a duplexer component 1000, for example, of an antenna duplexer. The duplexer component has a terminal 1 for applying an input signal ES, for example, a transmission signal, which is forwarded to a transmitting/receiving device 300. Furthermore, the duplexer component has an output terminal 3 for outputting an output signal RS1 and an output terminal 4 for outputting an output signal RS2. The output signals RS1 and RS2 can be, for example, reception signals that have been received by the transmitting/receiving device 300. The transmitting/receiving device 300 can be an antenna, for example, which is connected to a terminal 2 for connecting the transmitting/receiving device 300.

A surface acoustic wave filter 100, serving as a reception filter, is arranged in a reception path EP between the terminal 2 for connecting the antenna 300 and the output terminals 3 and 4. The reception filter has an input terminal E100 for applying an input signal AS, for example, the signal received by the antenna. An output signal RS1 is output at the output terminal 3 and an output signal RS2 is output at the output terminal 4. The reception filter has an asymmetrical input side (unbalanced or single-ended) and a symmetrical output side (balanced). For this purpose, the surface acoustic wave filter 100 is embodied in such a way that the output signals RS1 and RS2 have a phase difference of 180°.

A transmission filter 200 is connected into a transmission path SP between the terminal 2 for connecting the antenna and the input terminal 1 for applying the transmission signal. The transmission filter can likewise be embodied as a surface acoustic wave filter. The surface acoustic wave filter receives an input signal ES at the input terminal 1 and generates an output signal TS at an output terminal A200, the output signal being fed to the antenna 300. The transmission filter has only one input terminal and one output terminal and is therefore operated in an asymmetrical (single-ended/single-ended or unbalanced/unbalanced) manner on the input and output sides.

FIG. 2 shows an overall transfer function of the duplexer component 1000, formed from the transfer function of the reception filter 100 and of the transmission filter 200. The reception filter can be arranged above the transmission filter in terms of frequency. In the exemplary embodiment in FIG. 2, the transmission and reception filters are embodied in such a way that the center frequency $f_E$ of the reception filter lies above the center frequency $f_S$ of the transmission filter. The reception filter has, for example, a passband D100 lying between the frequencies f1 and f2. In the passband of the filter 100, the insertion loss of the transmission filter is lower than the insertion loss of the reception filter. In particular, a stop band S200 of the transmission filter lies in the passband D100 of the reception filter.

A passband D200 of the transmission filter is arranged at lower frequencies than the passband D100 of the reception filter. In the passband D200 of the transmission filter, the insertion loss of the reception filter is higher than the insertion loss of the transmission filter. The reception filter has a stop band S100 in the passband D200 of the transmission filter.

It is generally required that the transmission filter have a high insertion loss in the passband of the reception filter, and that the reception filter have a high insertion loss in the passband of the transmission filter. Furthermore, there is intended to be a high degree of isolation between the transmission path SP and the reception path EP, such that the signals in the transmission path and in the reception path do not interfere with one another.

FIG. 3 shows an embodiment of the transmission filter 200, which is embodied as a surface acoustic wave filter, in particular as a DMS (dual mode filter). The transmission filter has transducers 210, 220, 230, 240 and 250 arranged alongside one another on a carrier substrate 270. The carrier substrate can be, for example, a material composed of lithium tantalate, lithium niobate or quartz. A respective resonator 260 is arranged at the edges of the transducer track. The transducers 210, 230, and 250 are connected between the input terminal 1 and a terminal M for applying a reference potential, for example a ground potential. The transducers 220 and 240 are connected between the output terminal A200 and the terminal M for applying the reference potential.

FIG. 4 shows the structures of the individual transducers 210, 220, 230, 240 and 250. The transducers have in each case two comb-shaped structures, for example, composed of a metal. The comb-like structures of the individual transducers are arranged on the carrier substrate. The comb-like structures 211, 231 and 251 of the transducers 210, 230 and 250 are connected to the input terminal 1 for applying the input signal. The comb-like structures 212, 232 and 252 of the transducers 210, 230 and 250 are connected to the terminal M for applying the reference potential. The comb-like structures 221 and 241 of the transducers 220 and 240 are connected to the output terminal A200. The comb-like structures 222 and 242 are connected to the terminal M for applying the reference potential.

In the exemplary embodiment in FIG. 4, the transducers are arranged alongside one another on the carrier substrate in such a way that in each case inactive fingers of the comb-like structures of different transducers, that is to say fingers of comb-like structures which are connected to the terminal M for applying the reference potential, and active fingers of the different transducers, that is to say fingers of comb-like structures which are connected to the input or output terminal, lie opposite one another.

As a result, the coupling capacitances between the inactive comb-like structures of different transducers have virtually the same value. By way of example, coupling capacitances between the transducers 210 and 220 and the coupling capacitances between the transducers 230 and 240 have approximately the same value, for example, a value of 0.007 pF. Likewise, the coupling capacitances between comb-like structures of different transducers which are connected to the input and output terminals have virtually the same value. By way of example, the coupling capacitances between the transducers 220 and 230 and the coupling capacitance between the transducers 240 and 250 have approximately the same value, for example, a value of 0.026 pF.

FIG. 5 shows an embodiment 100*c* of the reception filter 100, in which the individual transducers are likewise interconnected with one another in a DMS structure. The transducers 10, 20, 30, 40 and 50 are arranged on a carrier substrate 70. Reflectors 60 are arranged marginally with respect to the transducer track on the carrier substrate 70. The carrier substrate can contain a material composed of lithium tantalate, lithium niobate or quartz. The transducers 10, 30 and 50 are connected between the input terminal E100 for applying the input signal ES and a terminal M for applying a reference potential, for example, a ground potential. The transducers 10, 30 and 50 are thus embodied as input transducers. The transducer 20 is embodied as an output transducer and is connected between the output terminal 3 for outputting the output signal RS1' and the terminal M for applying the reference potential. The transducer 40 acts as a further output transducer and is connected between the output terminal 4 for outputting the output signal RS2' and the terminal M for applying the reference potential.

FIG. 6 shows the interconnection of the transducers 10, 20, 30, 40, 50 of the surface acoustic wave filter 100 on the carrier substrate. The individual transducers have in each case two comb-like structures which can be formed from a metal and are arranged on the carrier substrate 70. The individual comb-like structures have fingers intermeshing from different sides of the comb-shaped structures. The input transducers 10, 30 and 50 have comb-like structures 11, 31 and 51 which are connected to the input terminal E100. The opposite comb-like structures 12, 32 and 52 of the input transducers 10, 30 and 50 are connected to the terminal M for applying the reference potential. The output transducer 20 has a comb-like structure 21 connected to the output terminal 3. The opposite comb-like structure 22 is connected to the terminal M for applying the reference potential. The output transducer 40 has a comb-like structure 41 connected to the output terminal 4. The opposite comb-shaped structure 42 is connected to the terminal M for applying the reference potential.

In the case of the embodiment 100*c* of the surface acoustic wave filter 100 which is shown in FIGS. 5 and 6, inactive fingers of the transducers 10 and 20, active fingers of the transducers 20 and 30, which are connected to the output terminal 3 or the input terminal E100, and inactive/active fingers of the transducers 30 and 40 and inactive/active fingers of the transducers 40 and 50 lie opposite one another. The arrangement of the transducers is substantially governed by the symmetrical embodiment of the output side of the surface acoustic wave filter 100. In contrast to the embodiment of the surface acoustic wave filter 200, both active/active and inactive/inactive finger pairs and active/inactive finger pairs occur adjacent to one another in the case of the embodiment of the reception filter 100. Consequently, the coupling capacitances between the individual transducers are also distinctly different from one another.

FIG. 7 shows an equivalent circuit diagram of the reception filter 100 for the stop band of the filter. The transducers 10, 20, 30, 40 and 50 are acoustically inactive in the stop band and act as capacitors. The input transducers 10, 30 and 50 respectively act as capacitors C10, C30 and C50 between the input terminal E100 and the output terminal M for applying the reference potential. Furthermore, coupling capacitances $C_{10,20}$ between the transducers 10 and 20, $C_{20,30}$ between the transducers 20 and 30, $C_{30,40}$ between the transducers 30 and 40 and $C_{40,50}$ between the transducers 40 and 50 are present by virtue of the transducers lying alongside one another.

The coupling capacitance $C_{10,20}$ is, for example, less than the coupling capacitances $C_{30,40}$ between the transducers 30 and 40 and $C_{40,50}$ between the transducers 40 and 50. The coupling capacitance $C_{10,20}$ is 0.007 pF, for example, while the coupling capacitances $C_{30,40}$ and $C_{40,50}$ are 0.009 pF. The highest coupling capacitance is between the transducers 20 and 30, in which active finger pairs are arranged alongside one another. The coupling capacitance $C_{20,30}$ can be 0.026 pF, for example.

On account of the asymmetrical arrangement of the transducers of the reception filter 100 operated asymmetrically on the input side and symmetrically on the output side and the associated different coupling capacitances between the transducers, the suppression of signals between the terminal 2 for connecting the antenna and the output terminal 3 and the suppression of signals between the terminal 2 and the output terminal 4 in the stop band of the filter 100 differ from one another. Likewise, in the stop band of the filter 100, the isolation for the transfer path between the input terminal 1 and the output terminal 3 differs from the isolation for the transfer path between the input terminal 1 and the output terminal 4. Consequently, a signal transfer path between input terminal 1 and output terminal 3 and a signal transfer path between input terminal 1 and output terminal 4 have non-uniform attenuation behavior and therefore behave asymmetrically with regard to their isolation properties.

FIG. 8 shows a transfer function for identifying the signal transfer between the input terminal 1 and the output terminal 3, by virtue of the illustration of the profile of an amplitude of the output signal RS1' against the frequency f. Furthermore, a transfer function for identifying a signal transfer between the input terminal 1 and the output terminal 4 is illustrated by the profile of the output signal RS2' as a function of the frequency f. Furthermore, the profile of a differential-mode signal or the profile of a differential signal DS', which identifies the difference in the two output signals RS1' and RS2', and the profile of a common-mode signal CS', which identifies the sum of the two output signals RS1' and RS2', are illustrated in FIG. 8.

On account of the unequal coupling capacitances, the transfer functions for the output signals RS1' and RS2' have different amplitudes, which result in an unfavorable isolation behavior in the stop band and an unfavorable suppression behavior in the passband of the surface acoustic wave filter 100. Although the amplitude of the differential-mode signal or of the differential signal DS' is smaller than the amplitudes of the individual output signals, extinction of the two output signals does not take place. The common-mode signal CS' is slightly increased relative to the individual output signals RS1' and RS2'.

FIG. 9A shows an embodiment 100a of the surface acoustic wave filter 100. In order to increase the symmetry in the stop band of the symmetrically operated surface acoustic wave filter 100, either the coupling capacitance $C_{20,30}$ can be decreased or the coupling capacitances $C_{30,40}$ or $C_{40,50}$ can be increased. In the embodiment shown in FIG. 9A, a capacitor 80 is connected between the output terminal 3 for outputting the output signal RS1 and the output terminal 4 for outputting the output signal RS2. Otherwise, the filter 100 corresponds to the embodiment 100c shown in FIG. 5 and comprising the transducers 10, 20, 30, 40 and 50 and the reflectors 60 which are arranged on the carrier substrate 70. The individual transducers are embodied in the manner explained with reference to FIG. 6 for the embodiment 100c.

Figure 9B:
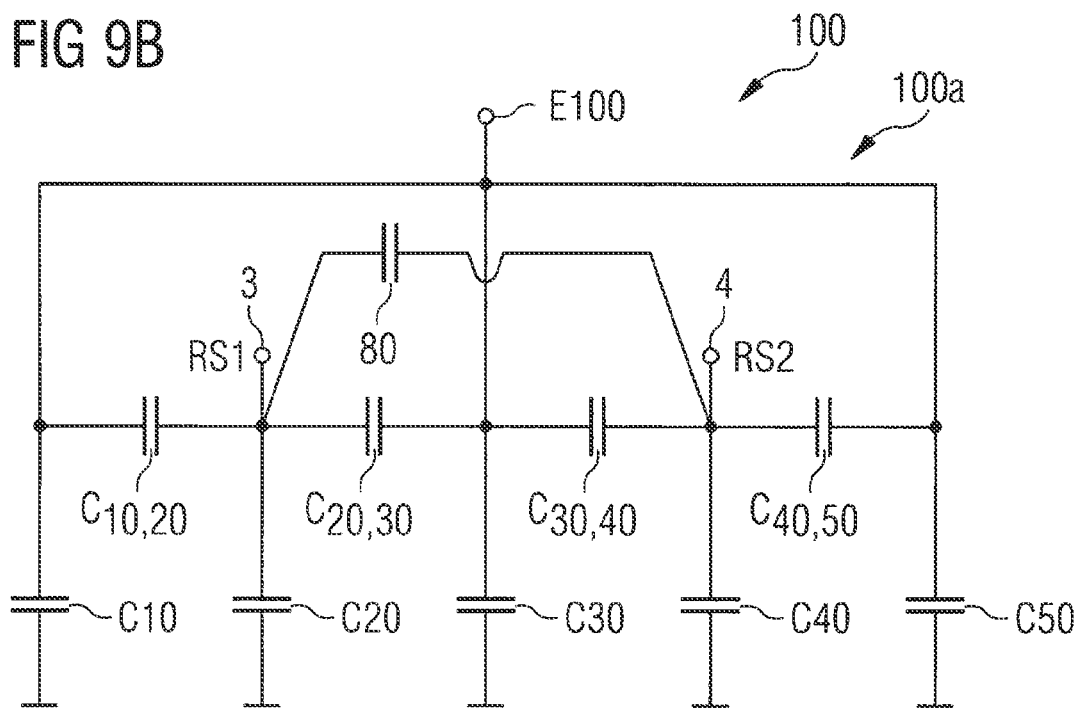
FIG. 9B shows an equivalent circuit diagram for an embodiment of a filter of a duplexer component in the stop band.

FIG. 9B shows the equivalent circuit diagram for the filter 100 of the embodiment 100a for frequencies in the stop band. In the stop band, the acoustic transducer structures are inactive and do not generate a surface acoustic wave. Consequently, the transducers, in a manner similar to that of FIG. 7, can be simulated by their static capacitances C10, C20, C30, C40, C50, which are connected with respect to the reference voltage terminal M, and by the coupling capacitors $C_{10,20}$, $C_{20,30}$, $C_{30,40}$, $C_{40,50}$, which act between the transducers. By supplementarily connecting the capacitor 80, the coupling capacitance $C_{20,30}$ is decreased and the coupling capacitance $C_{30,40}$ is increased. The track, initially embodied asymmetrically on account of the orientation of the transducers, can be made more symmetrical as a result. The unbalance between the coupling capacitances on account of the orientation of the transducer structures can be compensated for to the greatest possible extent. For one specific exemplary embodiment, the capacitor 80 can have, for example, a magnitude of a few pF, for example, a magnitude of between 0.1 pF and 100 pF.

Figure 10A:
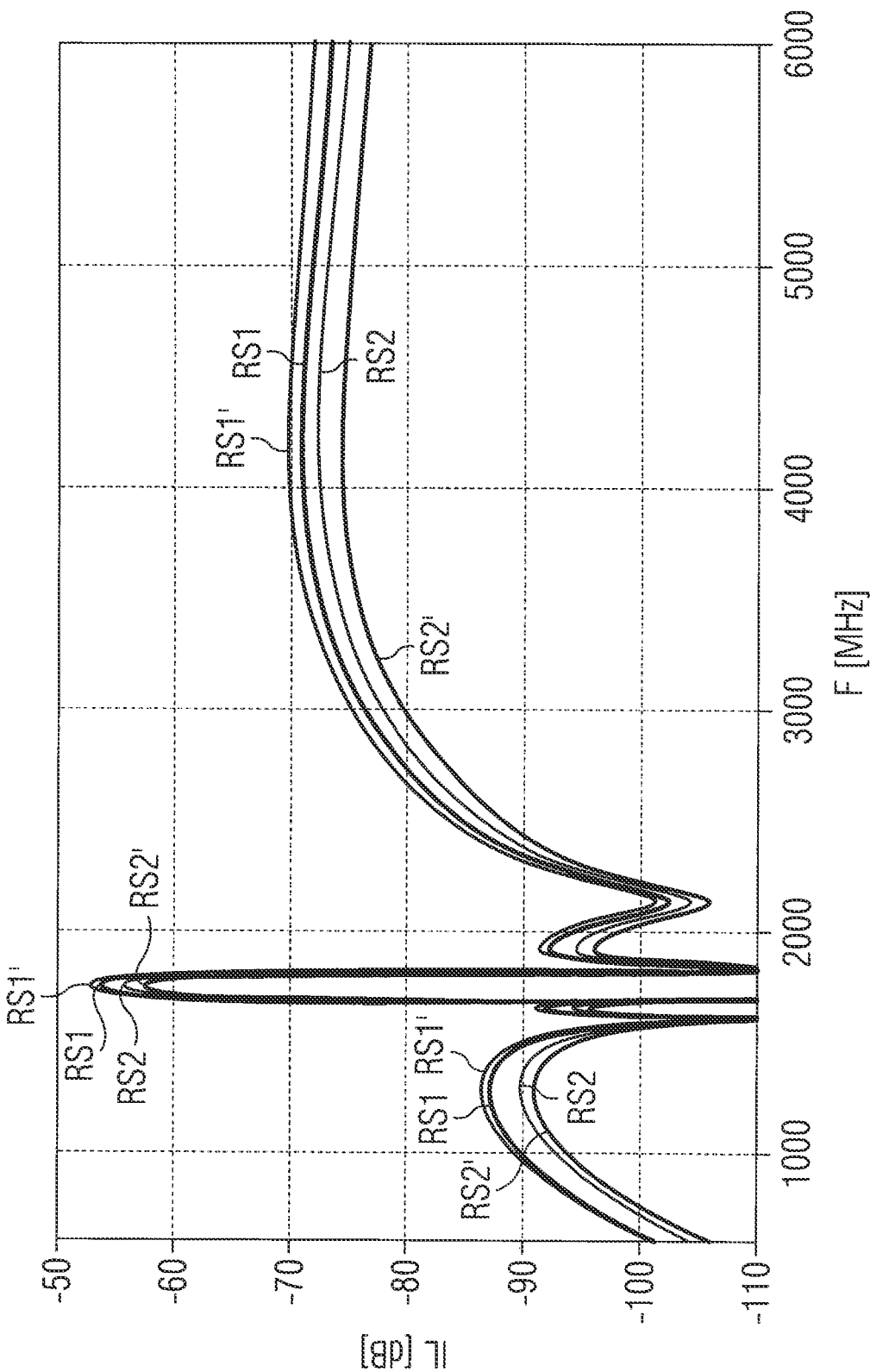
FIG. 10A shows transfer functions for identifying a signal transfer between a transmission path and reception path of a duplexer component.

FIG. 10A shows a comparison of the output signals RS1' and RS2' for the embodiment 100c of the surface acoustic wave filter as shown in FIGS. 3 to 7 and the output signals RS1 and RS2 for the embodiment 100a of the surface acoustic wave filter as shown in FIGS. 9A and 9B. In the example in FIGS. 10A, 10B and 10C, a capacitor 80 having a capacitance of 1.0 pF is connected between the output terminals 3 and 4. The output signals RS1' and RS2' for the unconnected surface acoustic wave filter without a capacitor 80 correspond to the transfer functions for the output signals RS1' and RS2' as shown in FIG. 8. The amplitude of the output signal RS1 for a surface acoustic wave filter connected up with the capacitor 80 is decreased relative to the output signal RS1' of the unconnected surface acoustic wave filter. Conversely, the amplitude of the output signal RS2 for the surface acoustic wave filter 100a connected up with the capacitor 80 is increased relative to the amplitude of the output signal RS2' of the unconnected surface acoustic wave filter 100.

FIG. 10B shows the differential-mode signal DS' and the common-mode signal CS' for the unconnected surface acoustic wave filter 100 and also the differential-mode signal DS and the common-mode signal CS for the surface acoustic wave filter 100a connected up with the capacitor 80. Since the difference in the amplitudes of the two output signals RS1 and RS2 is decreased, that is to say that the transfer function for the output signal RS1 and the transfer function for the output signal RS2 have approached one another more closely, the amplitude of the differential-mode signal DS is decreased relative to the amplitude of the differential-mode signal DS', while the common-mode signal has remained unchanged. The differential-mode isolation can be improved by approximately 5 dB in the exemplary embodiment of the surface acoustic wave filter 100a as shown in FIGS. 9A, 9B, 10A, 10B and 10C. FIG. 10C shows the profile of the amplitudes of the differential-mode and common-mode signals DS' and CS' and of the differential-mode and common-mode signals DS and CS in an enlarged illustration.

Figure 11A:
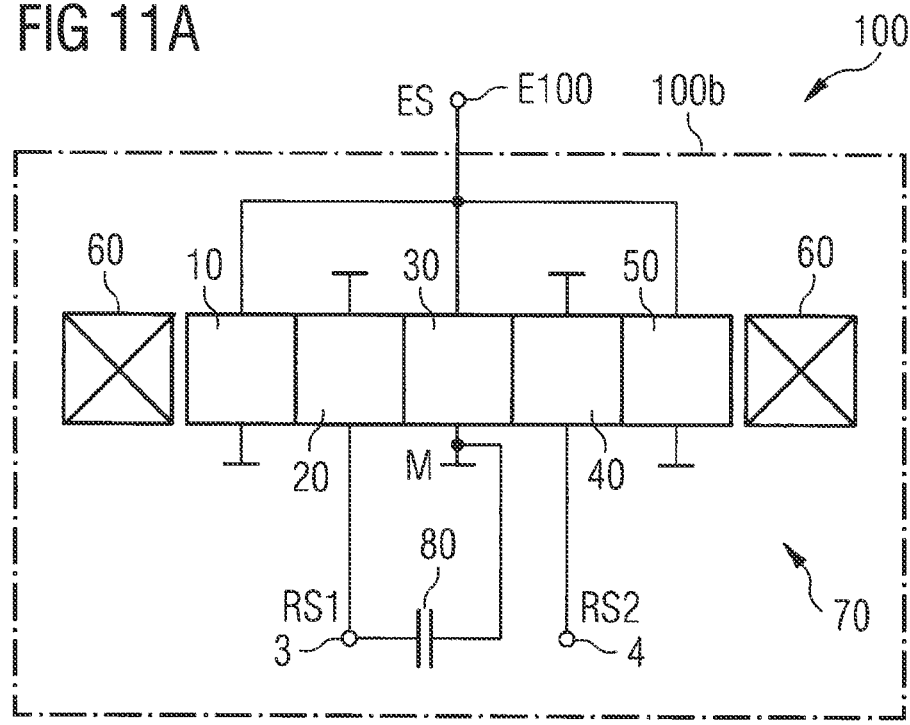
FIG. 11A shows an embodiment of a filter of a duplexer component.

FIG. 11A shows an embodiment 100b of the surface acoustic wave filter 100. In the exemplary embodiment in FIG. 11A, a capacitor 80 is connected between the output terminal 3 for outputting the output signal RS1 and the terminal M for applying the reference potential. Otherwise, the filter 100 corresponds to the embodiment 100c shown in FIG. 5 and comprising the transducers 10, 20, 30, 40, 50 and the reflectors 60 which are arranged on the carrier substrate 70. The individual transducers are embodied in the manner explained with reference to FIG. 6 for the embodiment 100c. In the exemplary embodiment shown in FIG. 11A, the capacitor 80 is connected between the output terminal 3 and the terminal M of the reference potential, to which the transducer 30 is also connected. Since the different terminals M for applying the reference potential have the same potential, the capacitor 80 can also be connected to the terminal M to which the transducer 20 is connected. The capacitor 80 is thus connected in parallel with the transducer 20.

Figure 11B:
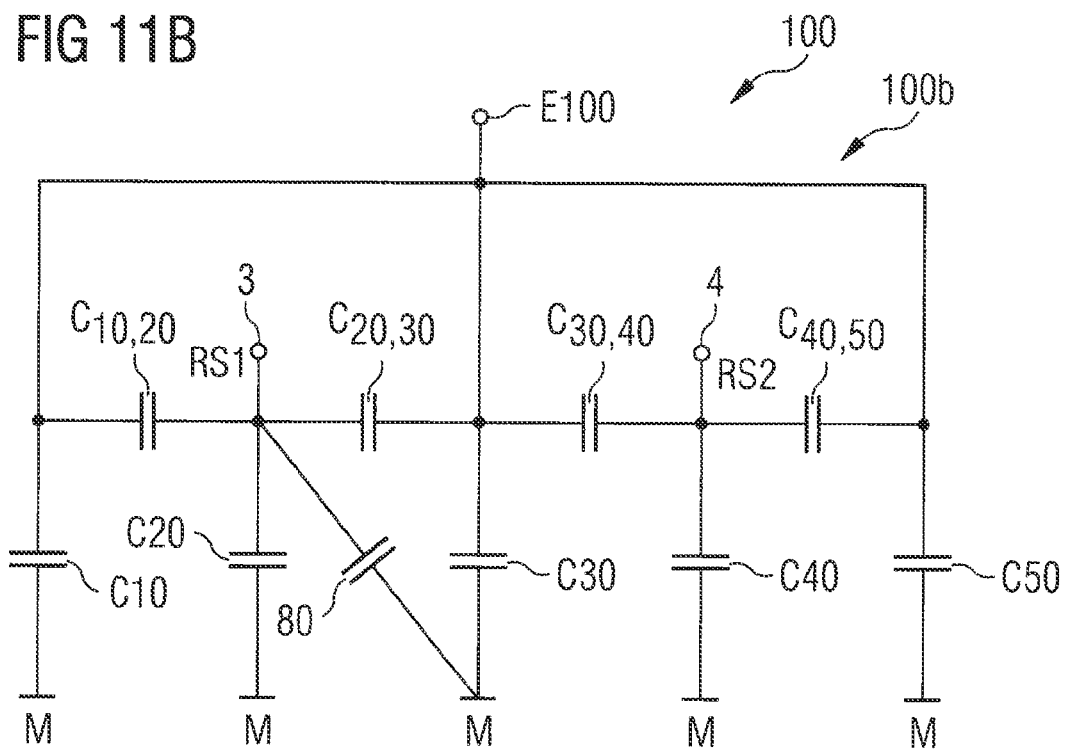
FIG. 11B shows an equivalent circuit diagram for an embodiment of a filter of a duplexer component in the stop band.

FIG. 11B shows the equivalent circuit diagram for the filter 100 of the embodiment 100b for frequencies in the stop band. In the stop band, the acoustic transducer structures are inactive and do not generate a surface acoustic wave. Consequently, the transducers, in a manner similar to that of FIG. 7, can be simulated by their static capacitances C10, C20, C30, C40, C50, which are connected with respect to the reference voltage terminal M, and by the coupling capacitors $C_{10,20}$, $C_{20,30}$, $C_{30,40}$, $C_{40,50}$, which act between the transducers. By connecting the capacitor 80 between the output terminal 3 and the terminal M for applying the reference potential, the symmetry of the asymmetrical DMS track is virtually re-established by the capacitance of the coupling capacitor $C_{20,30}$ being decreased and the capacitance of the coupling capacitor $C_{30,40}$ remaining unchanged.

Figure 12C:
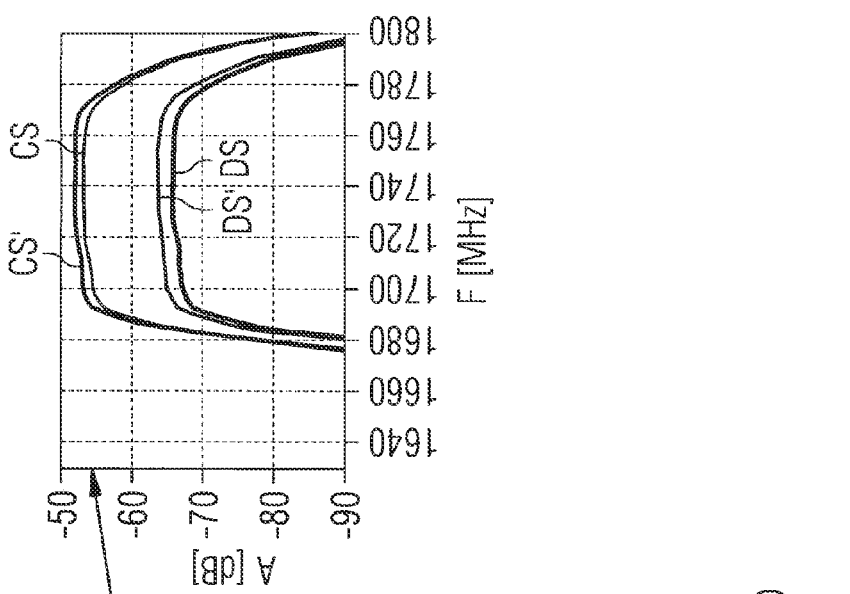
FIG. 12C shows transfer functions for identifying isolation between a transmission path and reception path of a duplexer component in an enlarged illustration.

FIG. 12A shows the profile of the output signals RS1' and RS2' for the unconnected surface acoustic wave filter 100 and the amplitude of the output signals RS1 and RS2 for the surface acoustic wave filter 100 of the embodiment 100b connected up with the capacitor 80 between the output terminal and the terminal for applying the reference potential. In the exemplary embodiment in FIGS. 11A, 11B, 12A, 12B and 12C, the capacitor 80 has a capacitance of 1.0 pF. In contrast to the output signal RS1', the amplitude of the output signal RS1 is decreased. The amplitudes of the output signals RS2' and RS2 are unchanged.

Figure 12B:
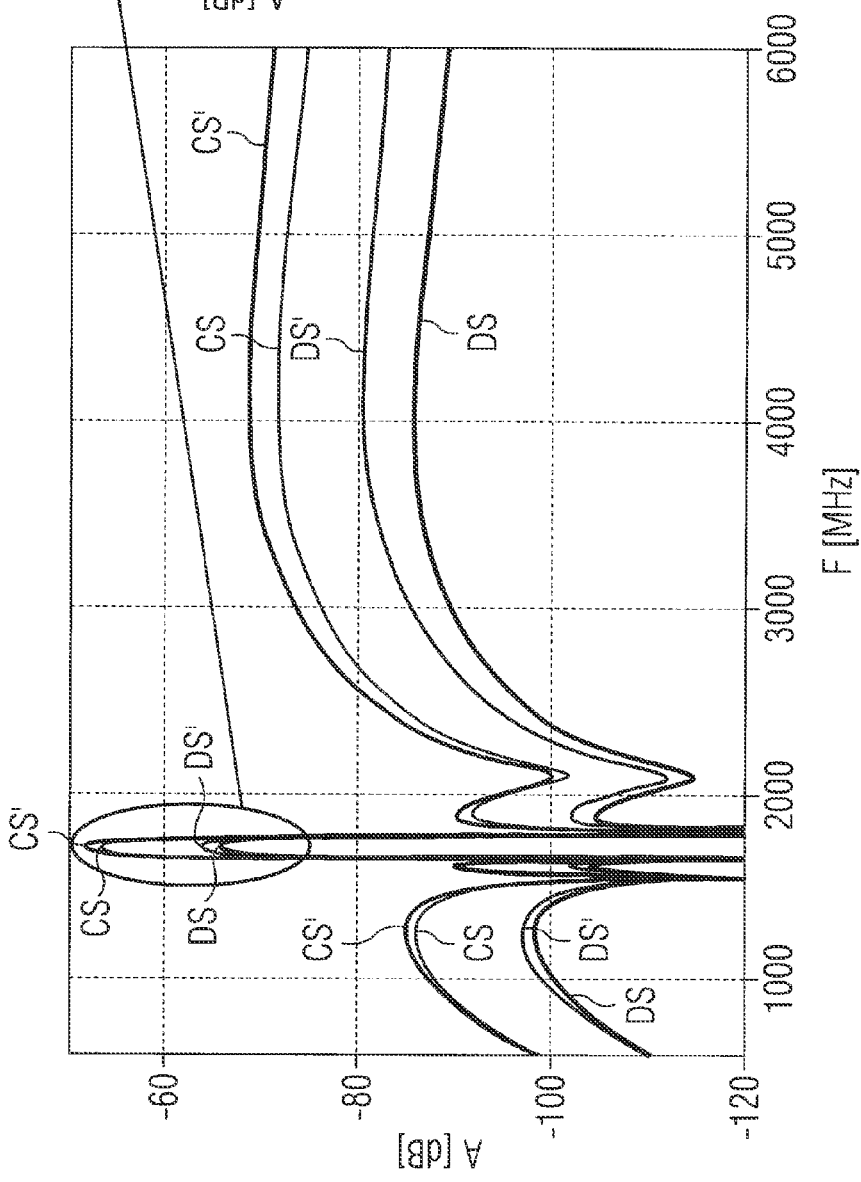
FIG. 12B shows transfer functions for identifying isolation between a transmission path and reception path of a duplexer component.

FIG. 12B shows the differential-mode and common-mode signals DS' and CS' for the unconnected surface acoustic wave filter 100 from FIG. 7 and the differential-mode signal DS and the common-mode signal CS for the surface acoustic wave filter 100 of the embodiment 100b connected up with the capacitor 80 between the output terminal 3 and the terminal M for applying the reference potential. Since the differences in amplitudes between the output signal RS1 and RS2 have been reduced by the surface acoustic wave filter being connected up in the manner shown in FIGS. 11A and 11B, the amplitude of the differential-mode signal DS is decreased relative to the amplitude of the differential-mode signal DS' and the amplitude of the common-mode signal CS is also decreased relative to the amplitude of the common-mode signal CS'. The differential-mode signal isolation can be improved by approximately 3 dB and the common-mode signal isolation can be improved by approximately 2 dB. FIG. 12C shows the profile of the differential-mode signals DS and DS' and of the common-mode signals CS and CS' in an enlarged illustration.

FIG. 13 shows a possibility for embodying the capacitor 80 on the basis of the embodiment 100b, which can likewise be applied to the embodiment 100a. The capacitor 80 is connected between the output terminal 3, which is connected to the transducer 20, and the reference voltage terminal M connected to the transducer 30. The transducers respectively have comb-shaped structures 21, 22 and 31, 32, which are arranged on the carrier substrate 70 in a manner oriented in such a way that a surface acoustic wave is generated in the carrier substrate when a voltage is applied to the respective structures of the transducers.

The capacitor 80 can likewise be embodied with comb-like structures 81, 82 on the carrier substrate 70. However, the comb-like structures 81, 82 of the capacitor are arranged on the carrier substrate 70 in a different direction than the comb-like structures 11, 21, 32, 41, 51, 12, 22, 32, 42, 52 of the transducers 10, 20, 30, 40, 50. In particular, the comb-like structures 81, 82 of the capacitor 80 are arranged on the carrier substrate 70 in such a way that no acoustic wave is excited when a voltage is applied to the comb-like structures 81, 82 of the capacitor in the carrier substrate. For this purpose, the structures 81, 82 of the capacitor 80 can be arranged relative to the respective structures 11, 21, 32, 41, 51, 12, 22, 32, 42, 52 of the transducers 10, 20, 30, 40, 50 in a manner rotated by 90° with respect to one another on the carrier substrate 70, as is shown by way of example in FIG. 13 on the basis of the transducer structures 21, 22 and 31, 32.

Despite asymmetrical arrangement of the individual transducers, a surface acoustic wave filter of the embodiments 100a and 100b enables a certain balancing of the transducer track. When a surface acoustic wave filter of this type is used in a duplexer component, for example, an antenna duplexer, the isolation between the transmission and reception signal paths can be significantly improved.

What is claimed is:

1. A surface acoustic wave filter, comprising:
an input terminal coupled to receive an input signal;
a first output terminal configured to output a first output signal;
a second output terminal configured to output a second output signal;
a reference terminal configured to apply a reference potential;
an arrangement of transducers configured to convert electrical/acoustic signals into acoustic/electrical signals, the arrangement of transducers comprising at least one first transducer coupled to the input terminal and the reference terminal, at least one second transducer coupled to the first output terminal and the reference terminal, and at least one third transducer coupled to the second output terminal and the reference terminal, respectively; and
a capacitor coupled to the first output terminal and/or the second output terminal and/or the reference terminal in a way that either the capacitor is coupled between the first and second output terminals or the capacitor is coupled between one of the first and second output terminals and the reference terminal;
wherein the at least one first, second and third transducers each have a first comb-shaped structure and a second comb-shaped structure;
wherein the first and second comb-shaped structures of each of the at least one first, second and third transducer are arranged on a carrier substrate;
wherein the capacitor is embodied as a comb-shaped structure on the carrier substrate;
wherein the comb-shaped structure of the capacitor is arranged on the carrier substrate in a different direction than that of the first and second comb-shaped structures of the at least one first, second and third transducers; and
wherein the comb-shaped structure of the capacitor is arranged on the carrier substrate in such a way that no acoustic wave is excited when a voltage is applied to the comb-shaped structure of the capacitor.

2. The surface acoustic wave filter according to claim 1, wherein the capacitor is coupled between the first output terminal and the second output terminal.

3. The surface acoustic wave filter according to claim 1, wherein the capacitor coupled between one of the first and second output terminals and the reference terminal.

4. The surface acoustic wave filter according to claim 1,
wherein the at least one first, second and third transducers are embodied in such a way that the first and second output signals each have an insertion loss relative to the input signal and wherein the respective insertion loss of the first and second output signals is dependent on a frequency of the input signal, and
wherein the first output signal has a phase shift relative to the second output signal.

5. The surface acoustic wave filter according to claim 1,
wherein the first comb-shaped structure of each of the at least one first, second and third transducer is coupled to the input terminal or the first output terminal or the second output terminal, and
wherein the second comb-shaped structure of each of the at least one first, second and third transducer is coupled to the reference terminal.

6. The surface acoustic wave filter according to claim 5,
wherein the first comb-shaped structure of the at least one first transducer is coupled to the input terminal,
wherein the first comb-shaped structure of the at least one second transducer is coupled to the first output terminal, and
wherein the first comb-shaped structure of the at least one third transducer is coupled to the second output terminal.

7. The surface acoustic wave filter according to claim 1, wherein the comb-shaped structure of the capacitor is rotated by 90° with respect to each of the first and second comb-shaped structures of the at least one first, second and third transducers.

8. The surface acoustic wave filter according to claim 1, wherein the at least one first, second and third transducers are interconnected with one another in such a way that a DMS filter is formed.

9. A duplexer component, comprising:
the surface acoustic wave filter according to claim 1,
a further surface acoustic wave filter comprising a further input terminal coupled to receive a further input signal and a further output terminal configured to output a further output signal,
a terminal for coupling a transmitting/receiving component,
wherein the input terminal of the surface acoustic wave filter and the further output terminal of the further surface acoustic wave filter are each coupled to the terminal for coupling the transmitting/receiving component.

10. The duplexer component according to claim 9, wherein the further surface acoustic wave filter comprises an arrangement of transducers, each transducer configured to convert electrical/acoustic signals into acoustic/electrical signals,
wherein the arrangement of transducers of the further surface acoustic wave filter are embodied in such a way that the further output signal has an insertion loss relative to the further input signal, the insertion loss being dependent on a frequency of the further input signal,
wherein the arrangement of transducers of the surface acoustic wave filter and the arrangement of transducers of the further surface acoustic wave filter are embodied in such a way that a passband of the surface acoustic wave filter and a passband of the further surface acoustic wave filter are spaced apart from one another.

11. The duplexer component according to claim 9, wherein the further surface acoustic wave filter comprises a plurality of first transducers that are respectively coupled between the further input terminal of the further surface acoustic wave filter and a second reference terminal,
wherein the further surface acoustic wave filter comprises a plurality of second transducers that are coupled between the further output terminal and the second reference terminal.

12. The duplexer component according to claim 11, wherein the reference terminal and the second reference terminal are each configured to apply a same reference voltage.

13. The duplexer component according to claim 12, wherein the reference terminal and the second reference terminal comprise a single terminal.

14. The duplexer component according to claim 9, wherein the further surface acoustic wave filter comprises an arrangement of transducers,
wherein the arrangement of transducers of the further surface acoustic wave filter comprises first transducers wherein each of the first transducers have a first further comb-shaped structure and a second further comb-shaped structure,
wherein the first further comb-shaped structure of the first transducers of the further surface acoustic wave filter are coupled to the further input terminal of the further surface acoustic wave filter, and the second further comb-shaped structures of the first transducers of the further surface acoustic wave filter are coupled to a second reference terminal,
wherein the arrangement of transducers of the further surface acoustic wave filter comprises seconds transducers wherein each of the second transducers have a first further comb-shaped structure and a second further comb-shaped structure,
wherein the further first comb-shaped structures of the second transducers of the further surface acoustic wave filter are coupled to the further output terminal of the further surface acoustic wave filter, and the second further comb-shaped structures of the second transducers of the further surface acoustic wave filter are coupled to the second reference terminal.

15. The duplexer component according to claim 14, wherein the first and second transducers of the further surface acoustic wave filter are arranged in such a way that one of the first further comb-shaped structures of the first transducers of the further surface acoustic wave filter is arranged alongside one of the first further comb-shaped structures of the second transducers of the further surface acoustic wave filter, and that one of the second further comb-shaped structures of the first transducers of the further surface acoustic wave filter is arranged alongside one of the second further comb-shaped structures of the second transducers of the further surface acoustic wave filter.

16. The duplexer component according to claim 9, wherein the terminal for connecting the transmitting/receiving component comprises a terminal for connecting an antenna.

* * * * *

UNITED STATES PATENT AND TRADEMARK OFFICE
CERTIFICATE OF CORRECTION

| | | |
|---|---|---|
| PATENT NO. | : 9,106,206 B2 | Page 1 of 1 |
| APPLICATION NO. | : 13/331937 | |
| DATED | : August 11, 2015 | |
| INVENTOR(S) | : Tobias Krems | |

It is certified that error appears in the above-identified patent and that said Letters Patent is hereby corrected as shown below:

In The Claims

In Col. 12, line 20, claim 14, delete "seconds" and insert --second--.

Signed and Sealed this
Fifteenth Day of December, 2015

Michelle K. Lee
*Director of the United States Patent and Trademark Office*